United States Patent

Byers et al.

[15] 3,652,938

[45] Mar. 28, 1972

[54] DUAL LOOP RECEIVER TUNING AND FREQUENCY TRACKING SYSTEM

[72] Inventors: Larry Joe Byers, Indianapolis, Ind.; James Maurice Keeth, Columbus, Ohio

[73] Assignee: RCA Corporation, New York, N.Y.

[22] Filed: June 9, 1970

[21] Appl. No.: 44,781

[52] U.S. Cl. ................................ 325/363, 325/469, 333/17

[51] Int. Cl. ................................ H04b 1/16

[58] Field of Search ................................ 325/363, 469, 470, 471; 331/44; 333/17; 334/11, 16, 17, 26, 27

[56] References Cited

UNITED STATES PATENTS 2,499,429 3/1950 Toth ................................ 325/363

2,726,326 12/1955 Winfield ................................ 325/469

2,978,655 4/1961 Fernsler ................................ 333/17

*Primary Examiner*—Benedict V. Safourek

*Attorney*—H. Christoffersen

[57] ABSTRACT

A first servo loop responsive to the beat frequency produced in a receiver automatically tunes an oscillator coupled to the input circuit of the receiver to the receiver frequency. A second servo loop then tunes the receiver to desired frequencies within the receiver band, while the oscillator automatically tracks this tuning. The second loop may include a comparator for comparing voltages indicative of the frequencies to which it is desired to tune the receiver with a voltage employed for tuning the oscillator.

6 Claims, 1 Drawing Figure

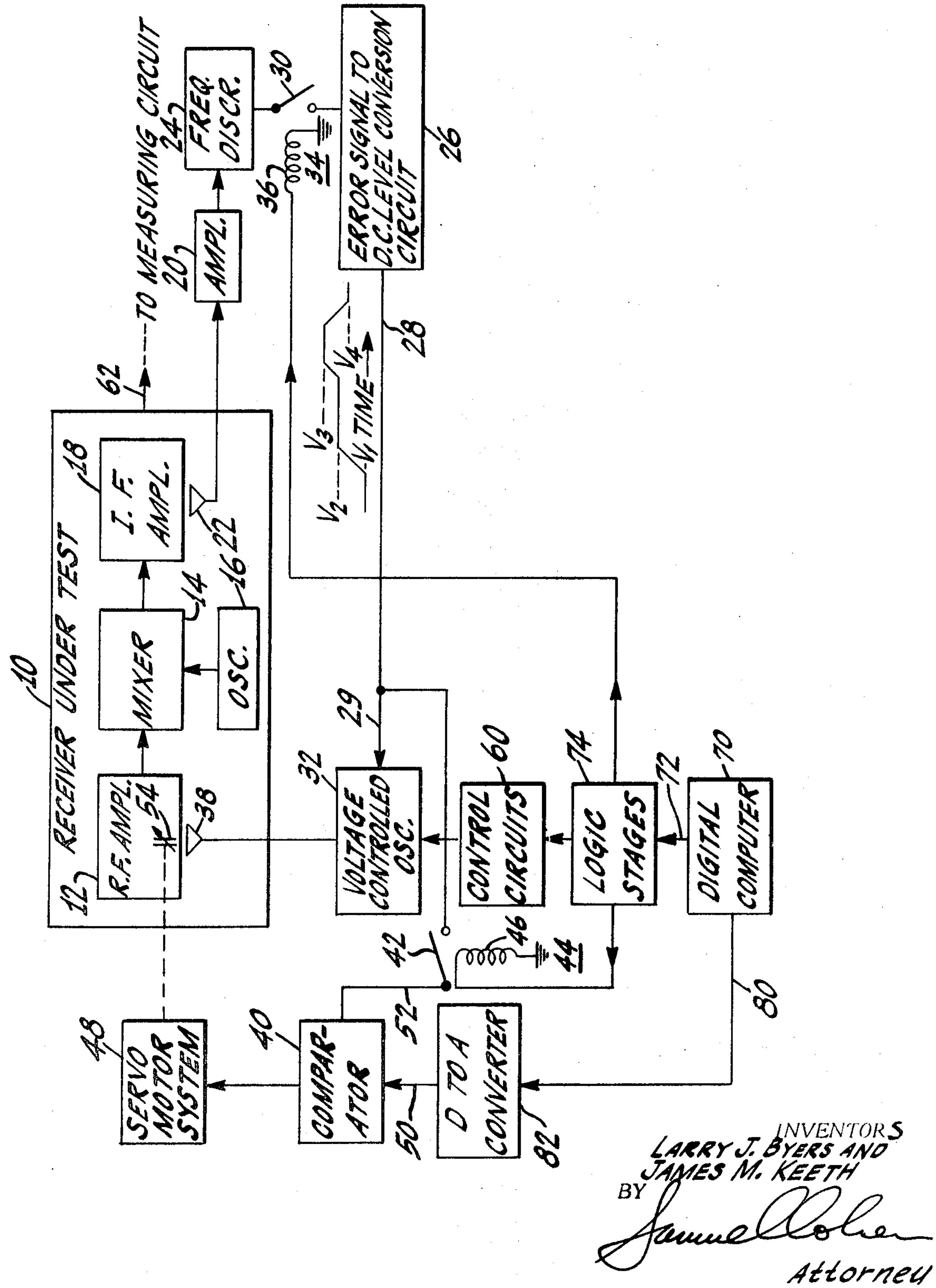
INVENTORS
LARRY J. BYERS AND
JAMES M. KEETH
BY [signature]
Attorney

DUAL LOOP RECEIVER TUNING AND FREQUENCY TRACKING SYSTEM

BACKGROUND OF THE INVENTION

There is a need in the manufacture of mass produced radio receivers for a simple and economic method for testing the receivers, preferably one which is suitable for computer control. The object of this invention is to provide an improved system for automatically tuning the receiver to the frequencies at which it is desired to perform such tests.

SUMMARY OF THE INVENTION

The tuning arrangement of the invention includes two servo loops, one for tuning the frequency of an external frequency source to that of a receiver, and the other for varying the tuning of the receiver. The latter loop may include a comparator which compares a voltage indicative of a frequency to which it is desired to tune the receiver with a voltage indicative of the frequency to which the receiver is tuned.

BRIEF DESCRIPTION OF THE DRAWING

The single figure is a block diagram of a preferred form of the present invention.

DETAILED DESCRIPTION

In the system shown in the FIGURE, for the sake of drawing simplicity single lines are shown interconnecting the various blocks. In some cases these lines represent single leads and in others multiple leads, as will be indicated during the discussion.

The receiver 10 under test is shown only schematically in the FIGURE. The radiofrequency amplifier 12, mixer 14, local oscillator 16 and intermediate-frequency (IF) amplifier 18 are illustrated and the remaining stages, while present, are not shown specifically. The tuning and tracking system for the receiver includes an amplifier 20 which is coupled to the IF amplifier 18 by means of a small antenna or loop 22. The arrangement is such as to pick up a small portion of the intermediate-frequency signal-sufficient to drive the amplifier. The amplifier 20 supplies its output to a frequency discriminator 24, sometimes also known as a ratio detector. The frequency discriminator is tuned to the intermediate-frequency of the receiver under test. As is well understood in this art, when the signal sensed by the frequency discriminator is equal to the intermediate frequency of the receiver under test, the output signal of the frequency discriminator is zero. However, at other times the frequency discriminator produces an output signal which has a sense for example, positive or negative, depending upon whether the signal present at the intermediate-frequency stage 18 is greater than or less than, respectively, the frequency to which the intermediate-frequency stage is tuned.

The signal produced by the frequency discriminator is applied to an error signal-to-direct current level conversion circuit 26. The switch 30 between these circuits, in practice, is part of a relay 34 but for purposes of the present discussion may be considered to be hand operated. The circuit 26 may take any one of several forms. As one example, block 26 may include a potentiometer connected between the two terminals of a voltage source and having a slider connected to line 28. It may also include a motor responsive to the signal produced by the frequency discriminator for driving the slider in a direction to cause the frequency discriminator output to reduce to zero, when the switch 30 is closed.

As a second alternative, block 26 may include relay means responsive to the output of the discriminator for effectively connecting a relatively positive or relatively negative voltage source to an integrator. In the operation of this form of the circuit, when the frequency discriminator output is some value other than zero, the relay means connects the one of the voltage sources to the integrator dependent upon whether the sensed frequency is greater or less than the receiver intermediate-frequency, and the integrator thereupon produces a ramp voltage of corresponding relative polarity. In both cases, the ramp direction is in a sense to reduce the frequency discriminator output to zero when the switch 30 is closed. For example, the ramp may be relatively positive as shown at $V_1$–$V_2$ when the sensed frequency is relatively high or relatively negative as shown at $V_3$–$V_4$ when the sensed frequency is relatively low. When the frequency discriminator output reduces to zero, the relay means within block 26 disconnects the voltage source from the integrator and the latter's output remains at the direct voltage level present at that time, as shown by the waveform.

Line 28 is connected to a voltage controlled oscillator 32. The voltage controlled oscillator 32 applies its radiofrequency output to an antenna 38 or other means coupled to the radiofrequency stage 12 of the receiver under test.

The system of the FIGURE includes also a second servo loop. The latter comprises a comparator 40 connected through switch 42 to the input lead 29 to the voltage controlled oscillator. As in the case of the first switch described, switch 42 may be considered to be manually operated for the present although, in practice, it comprises the contacts of a relay 44 having a coil 46.

The comparator 40 is connected to a servo motor system 48. The latter may include a reversible motor and means such as relays responsive to the comparator 40 output for applying current in either direction to one of the motor windings for causing the motor to operate. The servo motor system may also include means such as relay means responsive to a comparator output indicative of equality of voltages present on leads 50 and 52 for shorting one of the motor windings to stop the motor, for braking the motor, opening a connection between the power source and the motor or in some other way causing the motor to stop. The reversible motor of system 48 is mechanically coupled to a tuning element of the RF stage 12 as, for example, the gang capacitor illustrated schematically at 54.

In the operation of the system as described so far, to start with switch 42 is open and switch 30 is closed. This closes the first servo loop. If the frequency produced by oscillator 32 is not equal to the frequency to which the receiver 10 is tuned, the beat frequency produced when this incoming frequency is mixed with the oscillator 16 frequency does not equal the frequency to which the intermediate-frequency amplifier 18 is tuned. The beat frequency is sensed by antenna 22, amplified by amplifier 20 and applied to the frequency discriminator 24.

The frequency discriminator produces an output voltage having a polarity indicative of the direction in which the beat frequency differs from the intermediate frequency. In response to this signal, the conversion circuit 26 produces a sweep voltage, for example one starting at voltage V1 and going toward voltage V2, which is applied as a tuning voltage to the voltage controlled oscillator 32. This tuning voltage changes the frequency of the oscillator 32 in a sense to cause the beat frequency produced by mixer 14 to approach the intermediate-frequency to which the intermediate-frequency amplifier 18 is tuned. The process continues until at voltage V2 the oscillator 32 is tuned to the same frequency to which the receiver 10 under test is tuned. At this time, the beat frequency produced in the mixer 14 is equal to the intermediate frequency. In response thereto, the output of the frequency discriminator 24 drops to zero. The conversion circuit 26 output thereupon stops changing and remains at level V2.

Suppose now that it is desired to adjust the gang capacitor 54 of the radiofrequency amplifier 12 to tune the receiver to a second frequency. A voltage indicative of this second frequency is applied to lead 50. For the moment it can be considered that the lead 50 is connected to the slider of the potentiometer and the slider is manually adjusted to the desired voltage value.

The switch 42 is now closed. Again it can be considered, for purposes of the present explanation, that this is done manually. As the voltage applied to lead 50 differs from the voltage applied to lead 52, the comparator 40 produces an output in a sense to cause the reversible motor of the system 48 to drive the capacitor 54 in a direction to tune the receiver to the desired frequency. As the first servo loop is still closed, the voltage controlled oscillator, in response to the feedback voltage produced by conversion circuit, 26 tracks this frequency. This process continues until the voltage at lead 52 becomes equal to the voltage on lead 50. When this occurs, the output of the comparator 40 is such as to cause the servo motor of system 48 to stop. As already mentioned, one method for accomplishing this in response to the comparator 40 voltage is to cause the contacts of a relay to short one of the motor windings.

An important attribute of the system described thus far is that the operation of the second servo loop need not be critically controlled. Even if the servo motor system 48 does not stop the tuning of the receiver 10 at the precise frequency called for by the voltage on lead 50, the first servo loop will still cause the oscillator 32 accurately to track the actual frequency to which the receiver 10 is tuned. In the present use of the system, namely to facilitate the testing of a receiver, it is more important that the external oscillator 32 lock on the frequency of the receiver under test than that the receiver under test be tuned to some precise value of frequency.

After the adjustments above have been made, it is possible to test the receiver in various ways. For example, the control circuits 60 may be employed to apply a modulating or attenuating voltage to the oscillator 32 for testing certain parameters such as the sensitivity, noise and stereo response of the receiver under test. When making these tests, the second servo loop may be opened by opening switch 42 and the bias applied via line 29 held at a fixed value by a holding circuit within block 26. The receiver response may be measured at an output lead such as 62 which may be connected to any one of a number of different circuit points in the receiver. For example, the lead 62 may be connected to one of the audio stages.

The system of the present invention is especially adaptable for automatic operation under the control of a digital computer 70, such as one of the stored program type. This computer applies binary inputs via a multiple conductor cable 72 to the logic stages 74. The latter, in response to one set of inputs, applies a current to the coil 36 of relay 34 causing the contacts 30 to close. In response to another set of binary inputs, the logic stages 74 apply current to the coil 36 of the relay 44 causing the contacts 42 to close. These and other sequential operations may be stored as a program in the memory of the computer and may be initiated in response to the movement of the receiver under test into the test position or in response to the depression by an operator of a push button. In addition, the logic stages 74 may, in response to other digital computer inputs, cause the relays 34 and 44 to open and control circuits 60 to modulate, attenuate and in other ways control the oscillator for causing the latter to apply appropriate stimuli to the receiver 10 for testing purposes.

There may also be stored in the computer a program indicative of the frequencies to which it is desired to tune the receiver under test. In response to this program, the computer applies successive binary words to the digital-to-analog converter via the multiple conductor cable 80, at appropriately spaced time intervals. Each such binary word represents a frequency. In response to such a word, the digital-to-analog converter 82 produces a direct voltage level and applies it via lead 50 to the comparator 40. During the application of each such word, the relays 36 and 46 are energized so that both servo loops are closed. Therefore, the servo motor system 48 tunes the receiver to the successive frequencies called for by the computer and the voltage controlled oscillator 32 tracks these frequencies.

The voltage to be applied to lead 50 which corresponds to a particular receiver frequency may be determined in advance by manually varying the voltage applied to lead 50 and measuring the receiver frequency. By series of such measurements a graph may be drawn showing the relationship of the voltage of lead 50 to this frequency. With such a graph, and knowing the characteristics of the converter 82, the digital computer may be programmed to control the operation of the second servo loop, as desired.

What is claimed is:

1. Apparatus for tuning an external frequency source to the frequency to which a radio receiver having an intermediate-frequency stage is tuned comprising, in combination:

a first servo loop including a frequency discriminator coupled to said intermediate-frequency stage for tuning said external frequency source to the frequency to which said receiver is tuned; and a second servo loop for adjusting the tuning of said receiver, said second servo loop including a comparator for producing a control voltage indicative of the difference between the frequency to which said receiver is tuned and the frequency to which it is desired that the receiver be tuned and means responsive to said control voltage for adjusting the tuning of said receiver.

2. Apparatus as set forth in claim 1 wherein said first servo loop includes means responsive to said frequency discriminator for producing a control voltage having an amplitude indicative of the difference between the initial frequency sensed by said frequency discriminator and the intermediate frequency to which said receiver is tuned, and which is applied to said external frequency source for controlling its frequency, and wherein the comparator of said second servo loop is receptive both of said control voltage produced in said first servo loop and of a command voltage indicative of the frequency to which it is desired that said receiver be tuned.

3. Apparatus as set forth in claim 1 wherein said receiver includes a gang capacitor and wherein said second servo loop includes means for mechanically tuning said gang capacitor.

4. Apparatus as set forth in claim 1, further including two switches, one in each servo loop, each for opening and closing its loop.

5. Apparatus as set forth in claim 4 wherein said switches comprise the contacts of relays.

6. Apparatus for tuning an external frequency source to the frequency to which a radio receiver is tuned comprising, in combination:

a first servo loop including said external frequency source for automatically tuning said source to the frequency to which said receiver is tuned; and a second servo loop for adjusting the tuning of said receiver, said second servo loop including means for producing a control voltage indicative of the difference between the frequency to which said receiver is tuned and the frequency to which it is desired that the receiver be tuned and means responsive to said control voltage for adjusting the tuning of said receiver.

* * * * *